(12) United States Patent
Takenaka

(10) Patent No.: US 10,164,589 B2
(45) Date of Patent: Dec. 25, 2018

(54) POWER AMPLIFIER CIRCUIT

(71) Applicant: Murata Manufacturing Co., Ltd., Kyoto (JP)

(72) Inventor: Kiichiro Takenaka, Kyoto (JP)

(73) Assignee: MURATA MANUFACTURING CO., LTD., Kyoto-Fu (JP)

(*) Notice: Subject to any disclaimer, the term of this patent is extended or adjusted under 35 U.S.C. 154(b) by 0 days.

(21) Appl. No.: 15/899,734

(22) Filed: Feb. 20, 2018

(65) Prior Publication Data

US 2018/0241362 A1 Aug. 23, 2018

(30) Foreign Application Priority Data

Feb. 21, 2017 (JP) ................. 2017-029788

(51) Int. Cl.
| | |
|---|---|
| *H03F 1/07* | (2006.01) |
| *H03F 3/21* | (2006.01) |
| *H03F 3/45* | (2006.01) |
| *H01F 27/00* | (2006.01) |
| *H03K 5/00* | (2006.01) |

(52) U.S. Cl.
CPC ............. *H03F 3/211* (2013.01); *H01F 27/00* (2013.01); *H03F 3/4508* (2013.01); *H03F 3/45179* (2013.01); *H03K 2005/00286* (2013.01)

(58) Field of Classification Search
CPC ............. H03F 1/07; H03F 3/68; H03F 1/0288
USPC .............................................. 330/295, 124 R
See application file for complete search history.

(56) References Cited

U.S. PATENT DOCUMENTS

| | | | | |
|---|---|---|---|---|
| 8,674,764 | B2* | 3/2014 | Kondo | H03F 1/0277 |
| | | | | 330/165 |
| 9,118,282 | B2* | 8/2015 | Choi | H03F 1/0261 |
| 2001/0030581 | A1* | 10/2001 | Dent | H02M 3/1582 |
| | | | | 330/297 |
| 2010/0019858 | A1* | 1/2010 | McMorrow | H03F 1/56 |
| | | | | 333/32 |
| 2012/0235734 | A1 | 9/2012 | Pengelly | |
| 2016/0013761 | A1 | 1/2016 | Takenaka | |

FOREIGN PATENT DOCUMENTS

| | | |
|---|---|---|
| JP | 2013-042527 A | 2/2013 |
| JP | 2014-511166 A | 5/2014 |
| JP | 2014-160916 A | 9/2014 |
| JP | 2016-019228 A | 2/2016 |
| JP | 2016-042695 A | 3/2016 |

* cited by examiner

*Primary Examiner* — Henry Choe
(74) *Attorney, Agent, or Firm* — Pearne & Gordon LLP

(57) ABSTRACT

A power amplifier circuit includes: a first differential amplifier that amplifies a first signal split from the input signal and outputs a second signal; a second differential amplifier that amplifies a third signal split from the input signal and outputs a fourth signal; a first transformer including a first input-side winding to which the second signal is input and a first output-side winding; a second transformer including a second input-side winding to which the fourth signal is input and a second output-side winding; a first phase conversion element that is connected in parallel with the first output-side winding and outputs a fifth signal; and a second phase conversion element that is connected in parallel with the second output-side winding and outputs a sixth signal. The first and second output-side windings are connected in series and output a signal obtained by adding voltages of the fifth and sixth signals together.

20 Claims, 14 Drawing Sheets

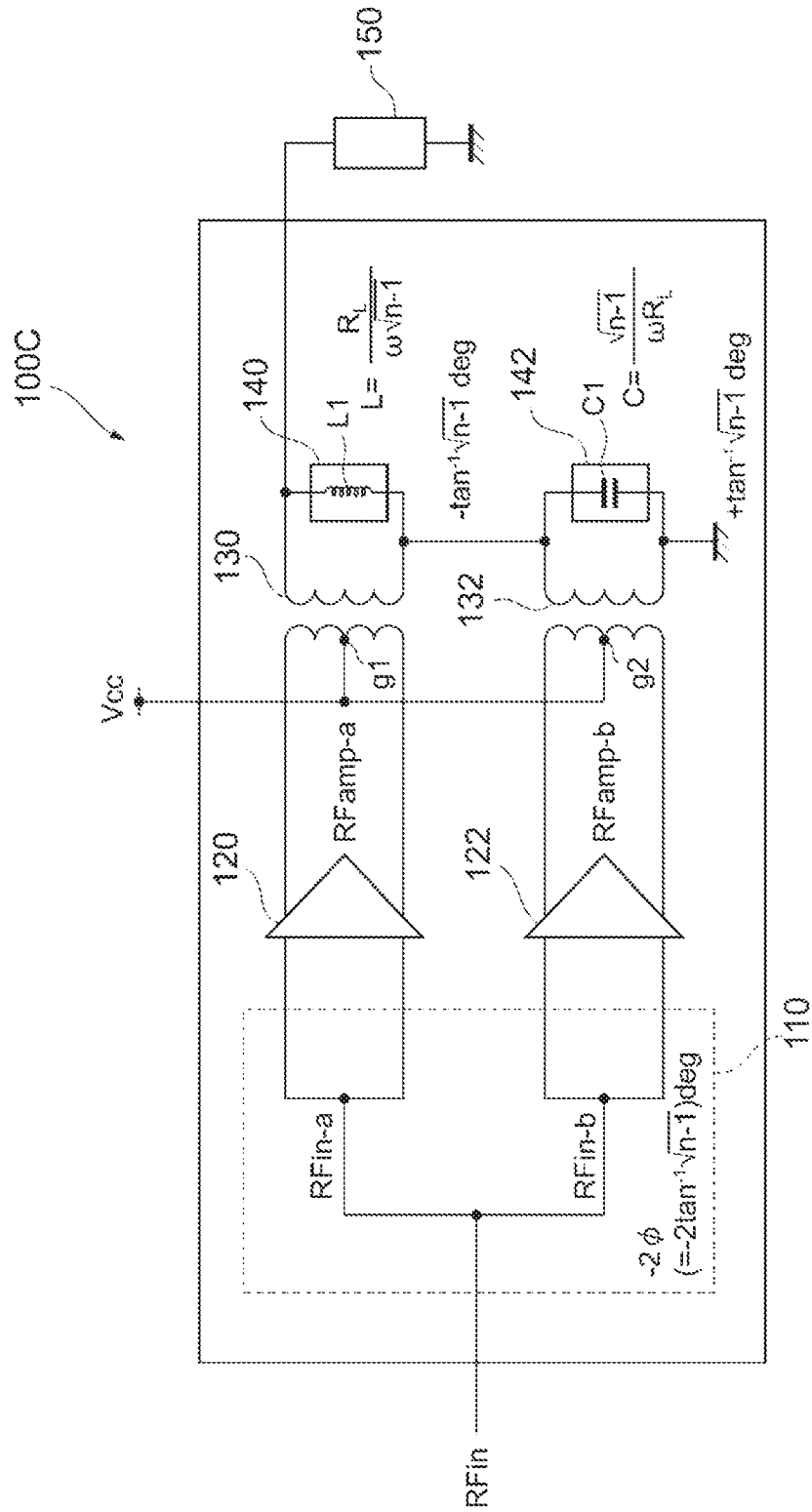

POWER AMPLIFIER CIRCUIT

This application claims priority from Japanese Patent Application No. 2017-029788 filed on Feb. 21, 2017. The content of this application is incorporated herein by reference in its entirety.

BACKGROUND

The present disclosure relates to power amplifier circuits. Doherty amplifiers are known as high-efficiency power amplifier circuits. A Doherty amplifier typically has a configuration in which a carrier amplifier, which operates irrespective of the power level of an input signal, and a peak amplifier, which is turned off when the power level of the input signal is small and is turned on when the power level of the input signal is large, are connected in parallel with each other. When the power level of the input signal is large, the carrier amplifier operates while maintaining saturation at a saturation output power level. As a result, a Doherty amplifier can realize improved efficiency compared with a normal power amplifier circuit.

As a modification of such a Doherty amplifier, for example, Japanese Unexamined Patent Application Publication No. 2016-19228 discloses a Doherty amplifier that is configured without using a λ/4 line, which is used in typical Doherty amplifiers.

Since the Doherty amplifier disclosed in Japanese Unexamined Patent Application Publication No. 2016-19228 is configured without using a λ/4 line, a reduction in circuit scale can be achieved compared with a typical Doherty amplifier. However, in this configuration, a power-supply choke coil and bypass capacitor are provided in order to suppress generation of noise caused by the power supply circuit. Therefore, further improvements are required when applying this configuration to cellular phone devices for which the demands for reduction of circuit scale have been becoming ever stricter in recent years.

BRIEF SUMMARY

The present disclosure provides a power amplifier circuit that realizes high efficiency and a reduction in circuit scale.

A power amplifier circuit according to an embodiment of the present disclosure includes: a first differential amplifier that amplifies, in an area where a power level of an input signal is greater than or equal to a first level, a first signal split from the input signal and outputs a second signal; a second differential amplifier that amplifies, in an area where the power level of the input signal is greater than or equal to a second level that is higher than the first level, a third signal that is split from the input signal and outputs a fourth signal, the third signal having a phase advanced relative to the first signal by approximately $2\phi$ degrees ($\phi$ is a real number satisfying $45 \leq \phi < 90$); a first transformer that includes a first input-side winding to which the second signal is input, and a first output-side winding that is electromagnetic-field-coupled to the first input-side winding; a second transformer that includes a second input-side winding to which the fourth signal is input, and a second output-side winding that is electromagnetic-field-coupled to the second input-side winding; a first phase conversion element that is connected in parallel with the first output-side winding and outputs a fifth signal having a phase advanced relative to a signal output from the first output-side winding by approximately $\phi$ degrees; and a second phase conversion element that is connected in parallel with the second output-side winding and outputs a sixth signal having a phase delayed relative to a signal output from the second output-side winding by approximately $\phi$ degrees. The first and second output-side windings are connected in series with each other and output an output signal obtained by adding together a voltage of the fifth signal and a voltage of the sixth signal.

According to the embodiment of the present disclosure, a power amplification circuit can be provided that realizes high efficiency and a reduction in circuit scale.

Other features, elements, and characteristics of the present disclosure will become more apparent from the following detailed description of embodiments of the present disclosure with reference to the attached drawings.

BRIEF DESCRIPTION OF THE SEVERAL VIEWS OF THE DRAWINGS

FIG. 4 is a diagram illustrating a state in which both the carrier amplifier and the peak amplifier are turned on;

FIG. 12 is a diagram illustrating another example configuration of the power amplifier circuit that is an embodiment of the present disclosure.

DETAILED DESCRIPTION

Figure 1:
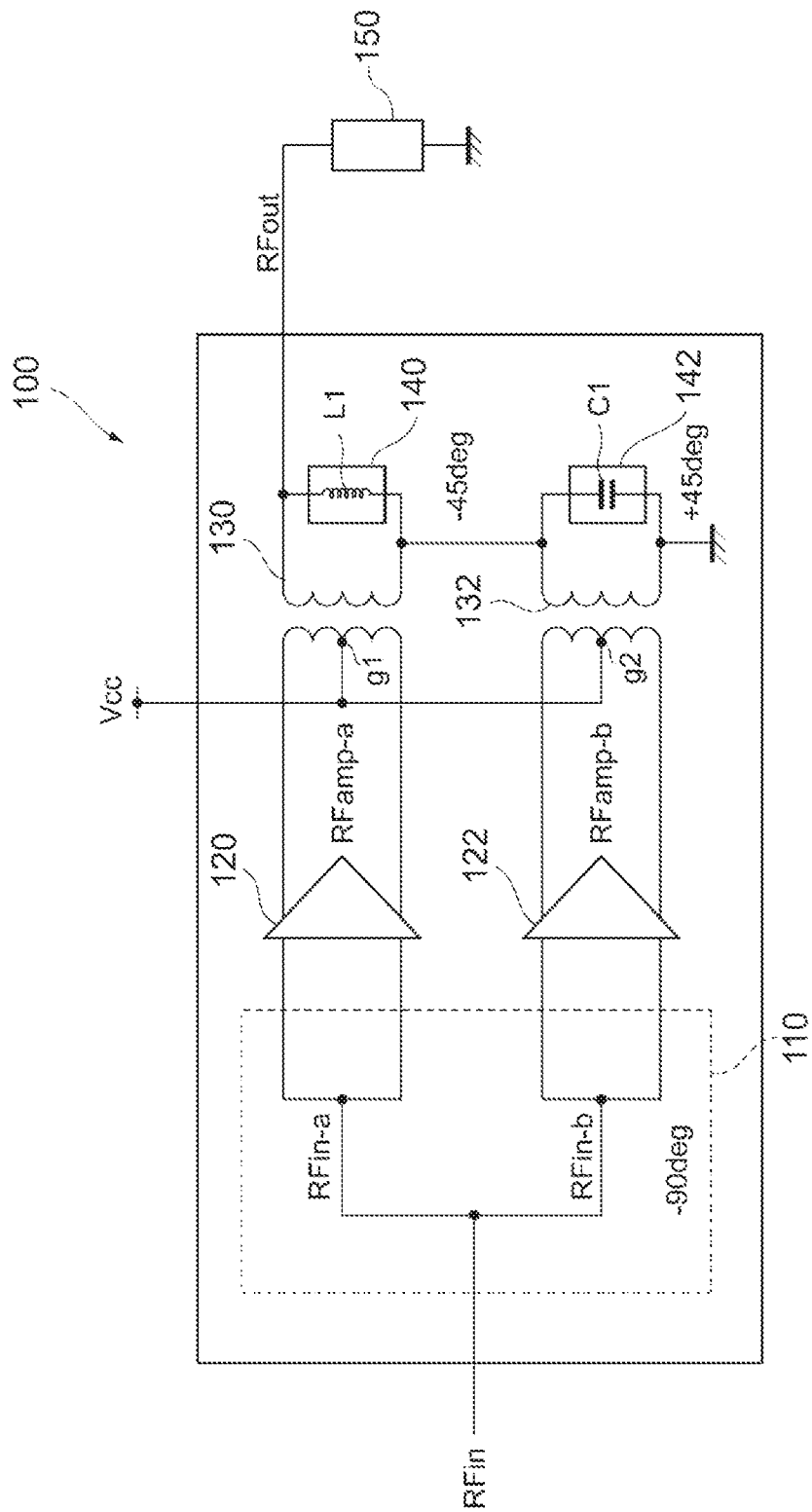
FIG. 1 is a diagram illustrating an example configuration of a power amplifier circuit that is an embodiment of the present disclosure.

Hereafter, embodiments of the present disclosure will be described in detail while referring to the drawings. In addition, elements that are the same as each other are denoted by the same symbols and repeated description thereof is omitted.

FIG. 1 is a diagram illustrating an example configuration of a power amplifier circuit 100 that is an embodiment of the present disclosure. The power amplifier circuit 100 is, for example, mounted in a cellular phone device, and is used to amplify the power of a signal that is to be transmitted to a base station. For example, the power amplifier circuit 100 can amplify the power of a signal of a communication standard such as the second generation mobile communication system (2G), the third generation mobile communication system (3G), the fourth generation mobile communication system (4G), the fifth generation mobile communication system (5G), the long term evolution (LTE)-frequency division duplex (FDD) system, the LTE-time division duplex (TDD) system, the LTE-Advanced system, the LTE-Advanced Pro system, and so on. The communication standard of a signal amplified by the power amplifier circuit 100 is not limited to these standards.

The power amplifier circuit 100 includes a power splitter 110, a carrier amplifier 120, a peak amplifier 122, transformers 130 and 132, and phase shifters 140 and 142. The power amplifier circuit 100 amplifies an input signal RFin and outputs an output signal RFout. The input signal RFin is a radio-frequency (RF) signal, and the frequency of the input signal RFin is approximately several GHz, for example. Hereafter, each constituent element of the power amplifier circuit 100 will be described.

The power splitter 110 splits the input signal RFin input thereto into a signal RFin_a (first signal) and a signal RFin_b (third signal), which has a phase that is advanced relative to the signal RFin_a by approximately 90 degrees. The carrier amplifier 120 and the peak amplifier 122 described hereafter are differential amplifiers, and therefore the signal RFin_a and the signal RFin_b are each further split into two input signals having a phase difference of approximately 180 degrees therebetween.

The carrier amplifier 120 (first differential amplifier) amplifies the signal RFin_a (first signal) input thereto, and outputs an amplified signal RFamp_a (second signal). In addition, the peak amplifier 122 (second differential amplifier) amplifies the signal RFin_b (third signal) input thereto, and outputs an amplified signal RFamp_b (fourth signal). In this embodiment, for example, the carrier amplifier 120 is biased so as to operate as a class AB amplifier, and the peak amplifier 122 is biased so as to operate as a class C amplifier. Thus, the carrier amplifier 120 is turned on irrespective of the power level of the input signal RFin, and the peak amplifier 122 is turned on only in the case where the power level of the input signal RFin is comparatively large.

Figure 2:
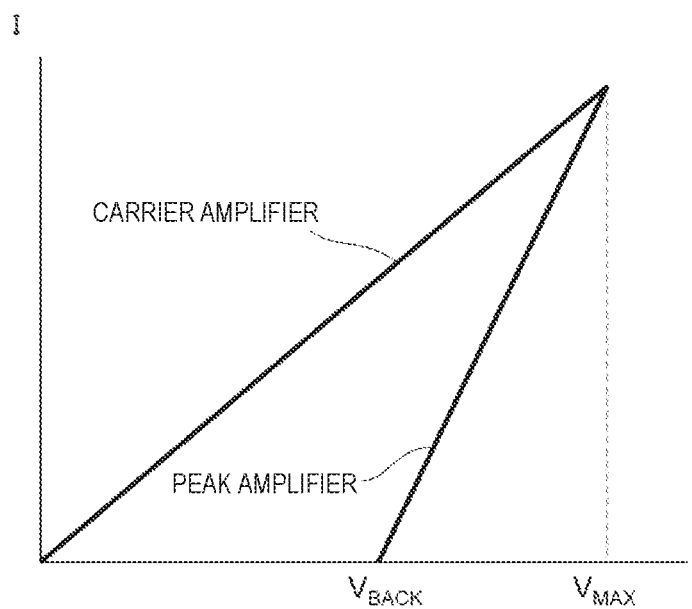
FIG. 2 is a diagram illustrating an example of operation characteristics of a carrier amplifier and a peak amplifier.

FIG. 2 is a diagram illustrating an example of the operation characteristics of the carrier amplifier 120 and the peak amplifier 122. In FIG. 2, the horizontal axis represents the voltage of the input signal RFin, and the vertical axis represents the currents of the amplifiers. As illustrated in FIG. 2, the carrier amplifier 120 operates irrespective of the voltage level of the input signal RFin. In other words, the carrier amplifier 120 operates in an area where the power level is greater than or equal to zero (first level) irrespective of the power level of the input signal RFin. On the other hand, the peak amplifier 122 operates in an area where the voltage level of the input signal RFin is greater than or equal to a level $V_{BACK}$ (second level) (hereafter, also referred to as back-off) that is a prescribed level lower than a maximum level $V_{MAX}$. In other words, the peak amplifier 122 operates in an area where the power level of the input signal RFin is a prescribed level lower than the maximum level $V_{MAX}$ (for example, approximately 6 dB) and is greater than or equal to a level (second level) that is higher than zero (first level). Thus, the area in which the carrier amplifier 120 operates close to the saturation output power is made wider by operating two amplifiers in combination with each other in accordance with the power level of the input signal. Therefore, the power efficiency is improved compared with a power amplifier circuit composed of only one amplifier.

Returning to FIG. 1, the carrier amplifier 120 and the peak amplifier 122 are each formed of a differential amplifier. A differential amplifier typically includes two amplifier elements, which form a pair of amplifier elements. Two signals, which have the same amplitude but opposite phases, are input to the two amplifier elements of the differential amplifier, and the differential amplifier amplifies and outputs a potential difference between the two signals. Therefore, in the case where signals having the same amplitude and the same phase as each other (for example, noise) are simultaneously input to the two amplifier elements, the signals having the same amplitude and the same phase as each other are cancelled out. In other words, the generation of noise and input signal harmonics can be suppressed by using differential amplifiers in the carrier amplifier 120 and the peak amplifier 122. The amplifier elements provided in the differential amplifiers are not particularly limited, and for example, bipolar transistors such as heterojunction bipolar transistors (HBTs) or field effect transistors such as metal-oxide-semiconductor field effect transistors (MOSFETs) may be used.

The transformers 130 (first transformer) and 132 (second transformer) are each equipped with an input-side winding and an output-side winding, which are electromagnetic-field-coupled to each other, and a signal input to the input-side winding is transmitted to the output-side winding. Specifically, the amplified signal RFamp_a (second signal), which is output from the carrier amplifier 120, is input to the input-side winding of the transformer 130 (first input-side winding) and output from the output-side winding of the transformer 130 (first output-side winding). Similarly, the amplified signal RFamp_b (fourth signal), which is output from the peak amplifier 122, is input to the input-side winding of the transformer 132 (second input-side winding) and output from the output-side winding of the transformer 132 (second output-side winding). In addition, the transformer 130 and the transformer 132 are cascade connected to each other. In other words, the output-side winding of the transformer 130 and the output-side winding of the transformer 132 are serially connected to each other. As a result, the amplified signal RFamp_a output from the carrier amplifier 120 and the amplified signal RFamp_b output from the peak amplifier 122 undergo voltage addition, and the combined output signal RFout is output. The phase conversion that the amplified signals RFamp_a and RFamp_b undergo when the two signals are combined will be described later.

A power supply voltage Vcc is supplied to center points g1 and g2 of the input-side windings of the transformers 130 and 132. In this case, since two output signals having opposite phases to each other are supplied from the carrier amplifier 120 or the peak amplifier 122 to the center points g1 and g2, the center points g1 and g2 serve as virtual grounding points. Therefore, as a result of the power supply voltage Vcc being supplied to the center points g1 and g2, noise caused by the power supply circuit can be suppressed. In other words, there is no need for the power amplifier circuit 100 to be equipped with a power supply choke coil and bypass capacitor. Thus, the power amplifier circuit 100 can realize a reduction in circuit scale compared with a configuration equipped with a power supply choke coil and bypass capacitor as disclosed in Japanese Unexamined Patent Application Publication No. 2016-19228 (hereafter, also referred to as the "example of the related art").

In addition, the transformers 130 and 132 can also be each given an impedance matching function by adjusting the winding ratio between the input-side winding and the output-side winding. Specifically, the input and output impedances of a transformer are matched when $(n1/n2)^2=Z1/Z2$ is satisfied, where n1 is the number of turns of the input-side winding, n2 is the number of turns of the output-side winding, Z1 is the input impedance, and Z2 is the output impedance. Therefore, in this embodiment, the output impedance of the carrier amplifier 120 or the peak amplifier 122 and the input impedance of a load 150 provided in a stage subsequent to the power amplifier circuit 100 can be matched. For example, if the winding ratios of the transformers 130 and 132 are each n1:n2=1:2, the impedance on the load side as seen from an output end of the carrier amplifier 120 or the peak amplifier 122 becomes approximately ¼. Thus, the impedances can be matched by the transformers 130 and 132, which are formed on a chip, without necessarily forming an output matching network outside of the chip. Therefore, the power amplifier circuit 100 can achieve a reduction in circuit scale compared with the example of the related art.

Next, phase conversion of the amplified signals output from the carrier amplifier 120 and the peak amplifier 122 will be described while referring to FIG. 3.

Figure 3:
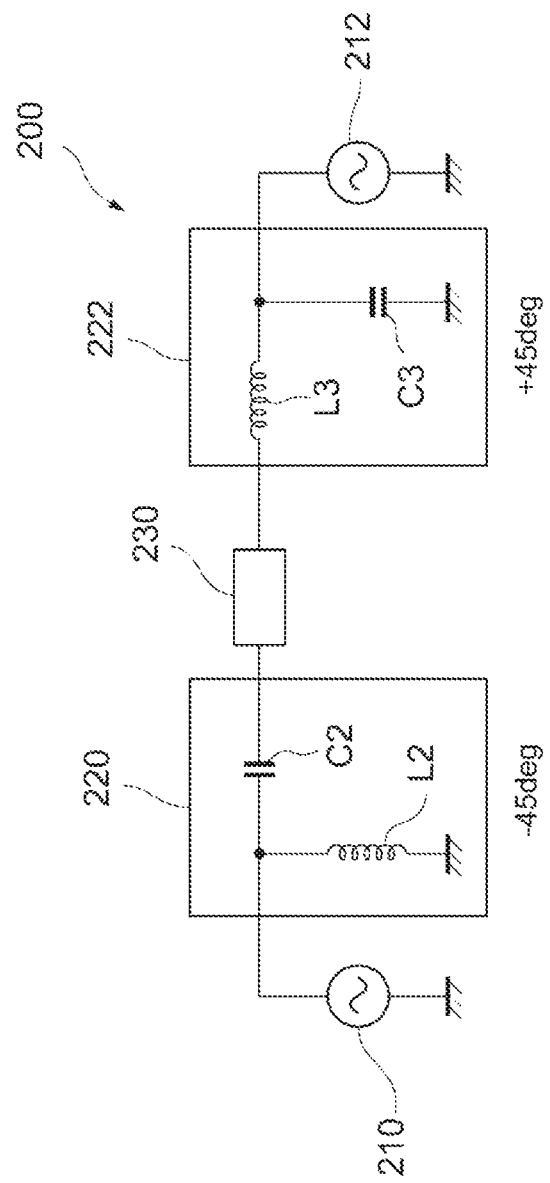
FIG. 3 is a diagram equivalently illustrating the configuration of part of the power amplifier circuit.

FIG. 3 is a diagram equivalently illustrating the configuration of part of the power amplifier circuit 100. An equivalent circuit 200 illustrated in FIG. 3 includes signal sources 210 and 212, phase shifters 220 and 222, and a load 230. The signal source 210 corresponds to the carrier amplifier 120, the signal source 212 corresponds to the peak amplifier 122, and the load 230 corresponds to the load 150.

The phase shifter 220 is an LC circuit that includes a capacitor C2 that is connected in series with a signal line, and an inductor L2 that is shunt-connected to the signal line. In addition, the phase shifter 222 is an LC circuit that includes an inductor L3 that is connected in series with the signal line, and a capacitor C3 that is shunt-connected to the signal line. In other words, the equivalent circuit 200 is a circuit obtained by designing the constants of the capacitors C2 and C3 and the inductors L2 and L3 such that the phase shifter 220 advances the phase of a signal by approximately 45 degrees and the phase shifter 222 delays the phase of a signal by approximately 45 degrees. In this case, the capacitor C2 and the inductor L3, which are connected in series with the signal line, resonate at the center frequency of an input signal, and therefore, the capacitor C2 and the inductor L3 can be omitted.

Returning to FIG. 1, the power amplifier circuit 100 includes the phase shifter 140 that is connected to the output-side winding of the transformer 130, and the phase shifter 142 that is connected to the output-side winding of the transformer 132. Specifically, the phase shifter 140 includes an inductor L1 (first phase conversion element: first inductor) (corresponding to inductor L2 in FIG. 3) that is connected in parallel with the output-side winding of the transformer 130. As a result, the phase shifter 140 outputs a signal (fifth signal) having a phase that is advanced by approximately 45 degrees relative to the signal output from the output-side winding of the transformer 130. In addition, the phase shifter 142 includes a capacitor C1 (second phase conversion element: first capacitor) (corresponding to capacitor C3 in FIG. 3) that is connected in parallel with the output-side winding of the transformer 132. As a result, the phase shifter 142 outputs a signal (sixth signal) having a phase that is delayed by approximately 45 degrees relative to the signal output from the output-side winding of the transformer 132.

As described above, the power amplifier circuit 100 is equipped with the phase shifters 140 and 142, whereby the phases of the amplified signals RFamp_a and RFamp_b, which were shifted by approximately 90 degrees from each other, are made to be the same as each other. The phase difference can be adjusted by setting the constants of the inductor L1 and the capacitor C1. Next, changes in the load impedance of the carrier amplifier 120 will be described while referring to FIGS. 4 and 5.

Figure 4:
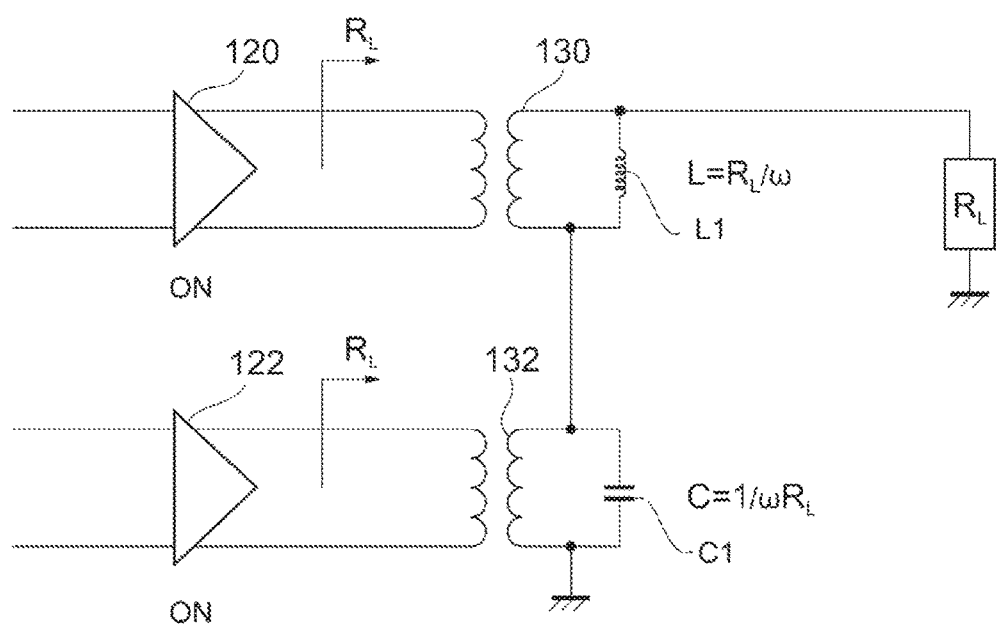
Figure 5:
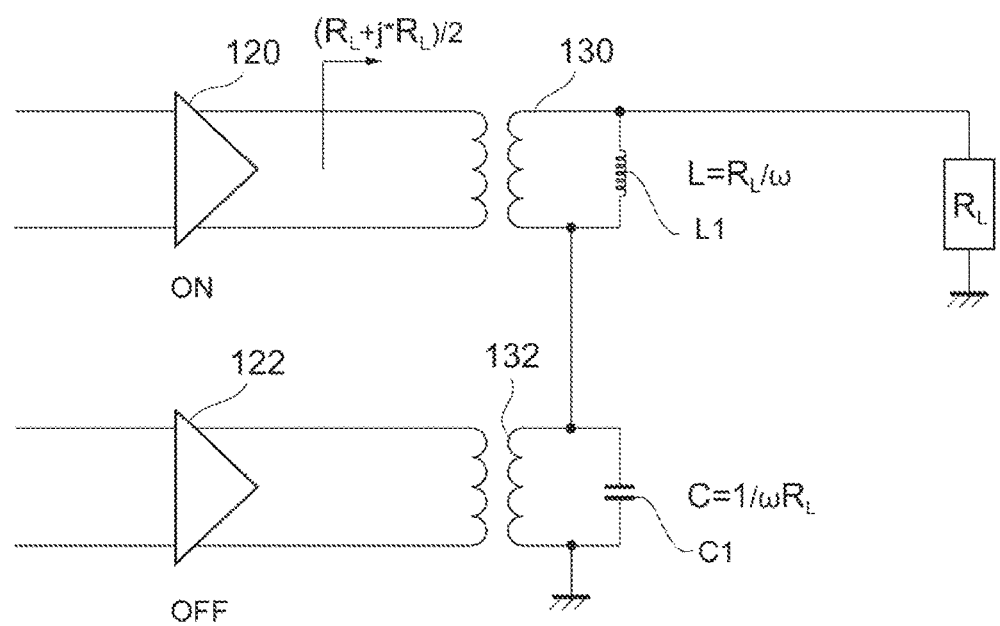
FIG. 5 is a diagram illustrating a state in which the carrier amplifier is turned on and the peak amplifier is turned off.

FIG. 4 is a diagram illustrating a state in which the carrier amplifier 120 and the peak amplifier 122 are both turned on and the currents thereof are equal to each other, in other words, a state in which the voltage level of the input signal RFin is V (hereafter, also referred to as "peak time"). In FIGS. 4 and 5, it is assumed that the transformers 130 and 132 are ideal transformers in which there is no effect from parasitic inductances, and that impedance conversion does not occur in the transformers 130 and 132. In this case, $R_L$ represents the impedance on the load side as seen from output ends of the carrier amplifier 120 and the peak amplifier 122, and w represents an angular frequency corresponding to the center frequency of the input signal RFin. The inductance of the inductor L1 is set to $L=R_L/\omega$, and the capacitance of the capacitor C1 is set to $C=1/\omega R_L$.

FIG. 5 is a diagram illustrating a state in which the carrier amplifier 120 is turned on and the peak amplifier 122 is turned off, in other words, a state in which the voltage level of the input signal RFin is in an area less than or equal to $V_{BACK}$ (hereafter, also referred to as "back-off time"). In this case, since the peak amplifier 122 is turned off, the output-side winding of the transformer 132 is in a shorted state. Therefore, the impedance on the load side as seen from the output end of the carrier amplifier 120 is given by $\{R_L \times j\omega \times (R_L/\omega)\}/\{R_L+j\omega \times (R_L/\omega)\}=(R_L+jR_L)/2$. In other words, it is clear that the impedance on the load side as seen from the output end of the carrier amplifier 120 changes as a result of the peak amplifier 122 being turned on and off in accordance with the power level of the input signal. Thus, high efficiency can be achieved in an area in which the voltage level of the input signal is less than back-off.

As described above, in the power amplifier circuit 100, the carrier amplifier 120 and the peak amplifier 122 are formed of differential amplifiers. In addition, the power supply voltage Vcc is supplied to the center points g1 and g2 of the transformers 130 and 132. Thus, the power amplifier circuit 100 can operate with high efficiency similarly to a Doherty amplifier without necessarily needing to be equipped with a harmonic termination circuit, or a power supply choke coil and bypass capacitor. Therefore, the power amplifier circuit 100 can achieve high efficiency and a reduction in circuit scale compared with the example of the related art. In addition, by adjusting the winding ratio between the transformers 130 and 132 of the power amplifier circuit 100, impedance matching can be realized between the power amplifier circuit 100 and the load without necessarily needing to form an output matching network outside the chip. For this reason as well, the power amplifier circuit 100 can achieve a reduction in circuit scale compared with the example of the related art.

Although a one-stage amplifier configuration is illustrated in FIG. 1, amplifiers may instead be connected in multiple stages. Specifically, for example, an initial stage (driver stage) may be formed of one amplifier and the Doherty amplifier configuration described above may be applied to an output stage (power stage), or amplifiers serving as an initial stage (driver stage) may be connected to the carrier amplifier and the peak amplifier serving as an output stage (power stage), as described later.

Figure 6A:
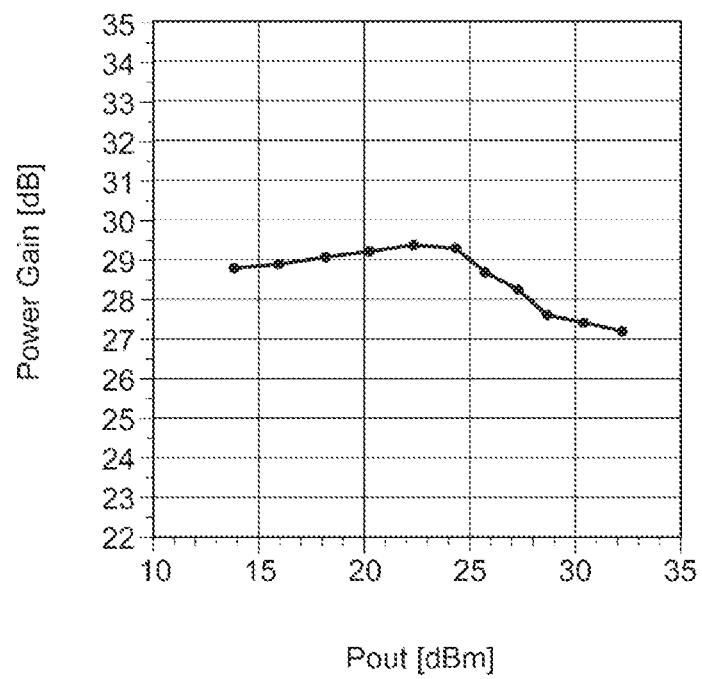
FIG. 6A is a graph depicting an example of simulation results of power gain in the power amplifier circuit.
Figure 6B:
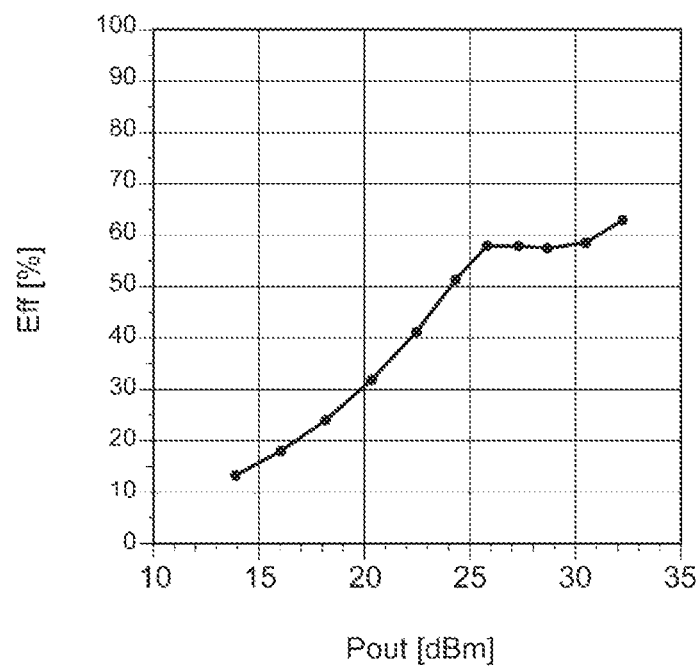
FIG. 6B is a graph depicting an example of simulation results of power-added efficiency in the power amplifier circuit.

FIG. 6A is a graph depicting an example of simulation results of power gain in the power amplifier circuit 100, and FIG. 6B is a graph depicting an example of simulation results of power-added efficiency in the power amplifier circuit 100. In the graph depicted in FIG. 6A, the horizontal axis represents output power (dBm), and the vertical axis represents power gain (dB). In addition, in the graph depicted in FIG. 6B, the horizontal axis represents output power (dBm), and the vertical axis represents power-added efficiency (%).

As illustrated in FIG. 6B, it is clear that efficiency improves as output power increases, and high efficiency is maintained in an area in which the output power is larger than 26 dBm (that is, when the output power is approximately 6 dB smaller than the output power of 32 dBm at peak time). In other words, it is clear that the power amplifier circuit 100 operates in the same manner as a typical Doherty amplifier.

In the above description, a case has been assumed in which the transformers 130 and 132 of the power amplifier circuit 100 are ideal transformers. However, parasitic inductances may affect the characteristics of actual transformers. Accordingly, an embodiment for a case where the parasitic inductances of the transformers 130 and 132 are taken into account will be described while referring to FIGS. 7 to 10.

Figure 7:
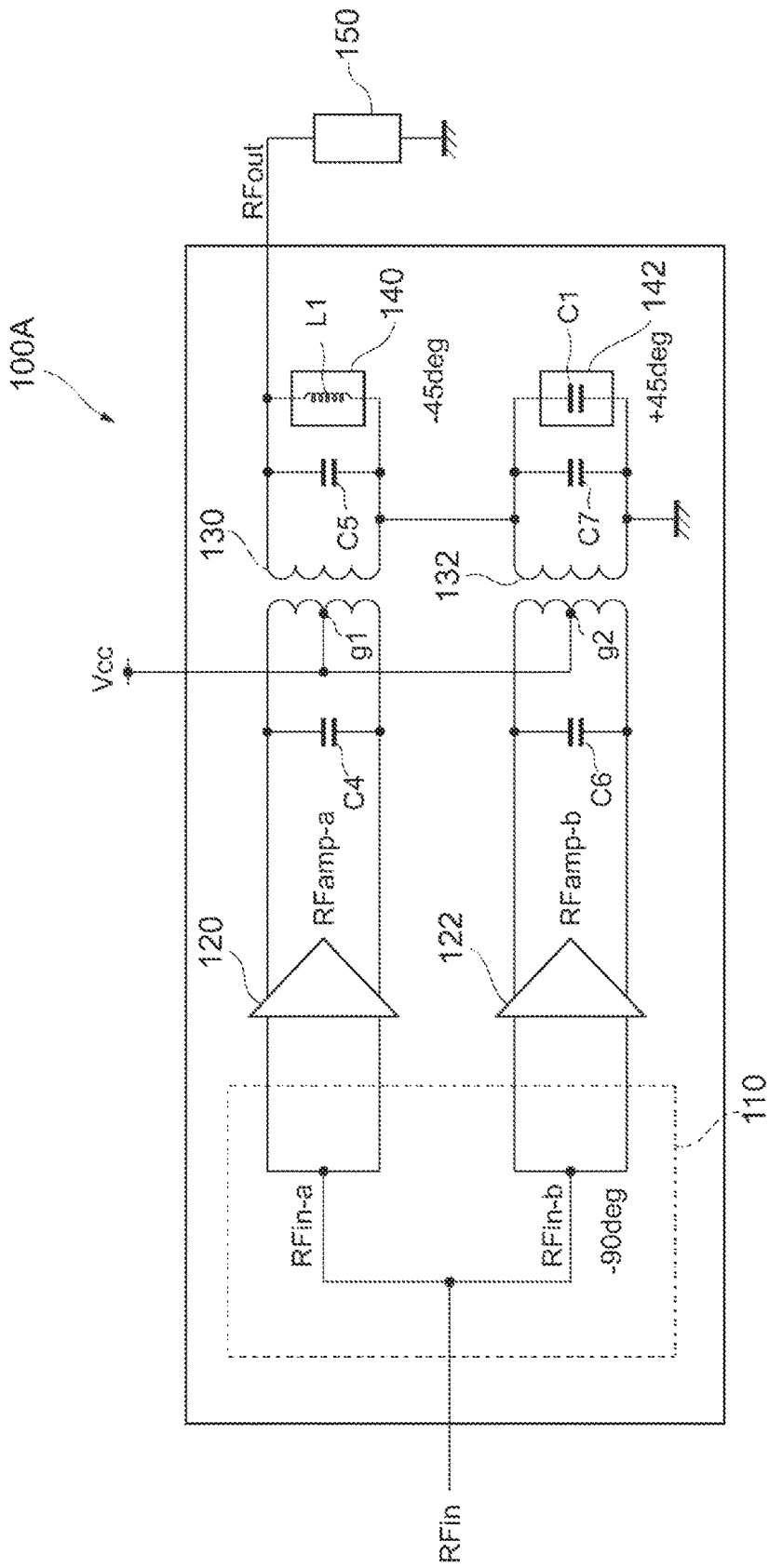
FIG. 7 is a diagram illustrating another example configuration of the power amplifier circuit that is an embodiment of the present disclosure.

FIG. 7 is a drawing that illustrates another example configuration (power amplifier circuit 100A) of the power amplifier circuit 100 that is an embodiment of the present disclosure. Constituent parts that are the same as in the power amplifier circuit 100 illustrated in FIG. 1 are denoted by the same reference symbols, and description thereof is omitted. In addition, hereafter, description of matters common to the first embodiment is omitted, and only differences are described. In particular, the same operational effects resulting from the same configurations will not be repeatedly described in individual embodiments.

In addition to the configuration of the power amplifier circuit 100, the power amplifier circuit 100A further includes capacitors C4 to C7. Specifically, the capacitor C4 (second capacitor) is connected in parallel with the input-side winding of the transformer 130, the capacitor C5 (third capacitor) is connected in parallel with the output-side winding of the transformer 130, the capacitor C6 (fourth capacitor) is connected in parallel with the input-side winding of the transformer 132, and the capacitor C7 (fifth capacitor) is connected in parallel with the output-side winding of the transformer 132. The capacitors C4 to C7 are provided in order to realize impedance matching for the transformers 130 and 132 in the case where the effects of the parasitic inductances of the transformers 130 and 132 are taken into account.

Figure 8:
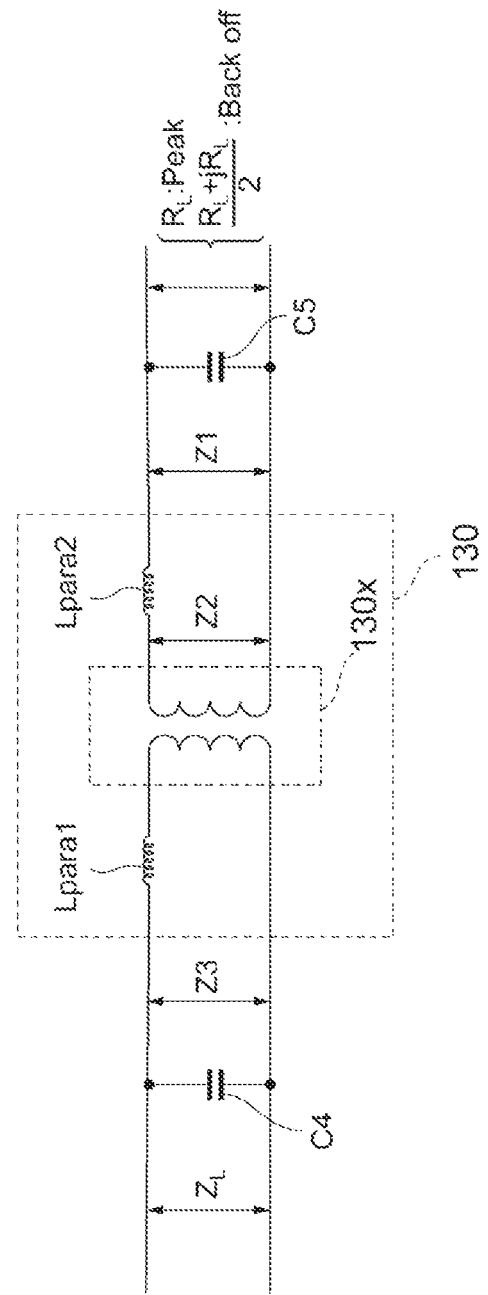
FIG. 8 is a diagram equivalently illustrating the configurations of a transformer and capacitors when taking parasitic inductances into account.

FIG. 8 is a diagram equivalently illustrating the configurations of the transformer 130 and the capacitors C4 and C5 when taking the parasitic inductances into account. The transformer 130 in FIG. 8 is represented by an ideal transformer 130X, and inductors Lpara1 and Lpara2 that are respectively serially connected to the input-side winding and the output-side winding of the ideal transformer 130X. In other words, the inductors Lpara1 and Lpara2 represent the parasitic inductances of the transformer 130. The power amplifier circuit 100A is provided with the capacitors C4 and C5 in order to compensate for the effect of the impedance conversion caused by the inductors Lpara1 and Lpara2.

Figure 9A:
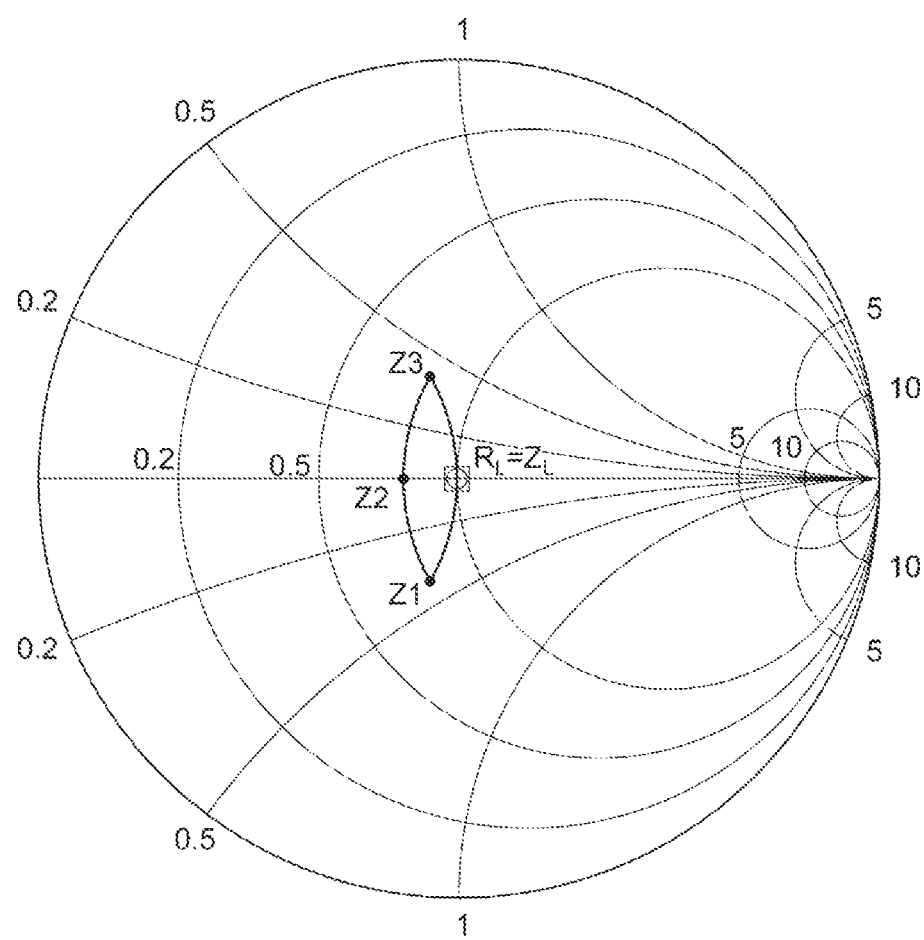
FIG. 9A is an explanatory diagram illustrating the locus of an impedance on the load side as seen from an output end of the carrier amplifier at a peak time.
Figure 9B:
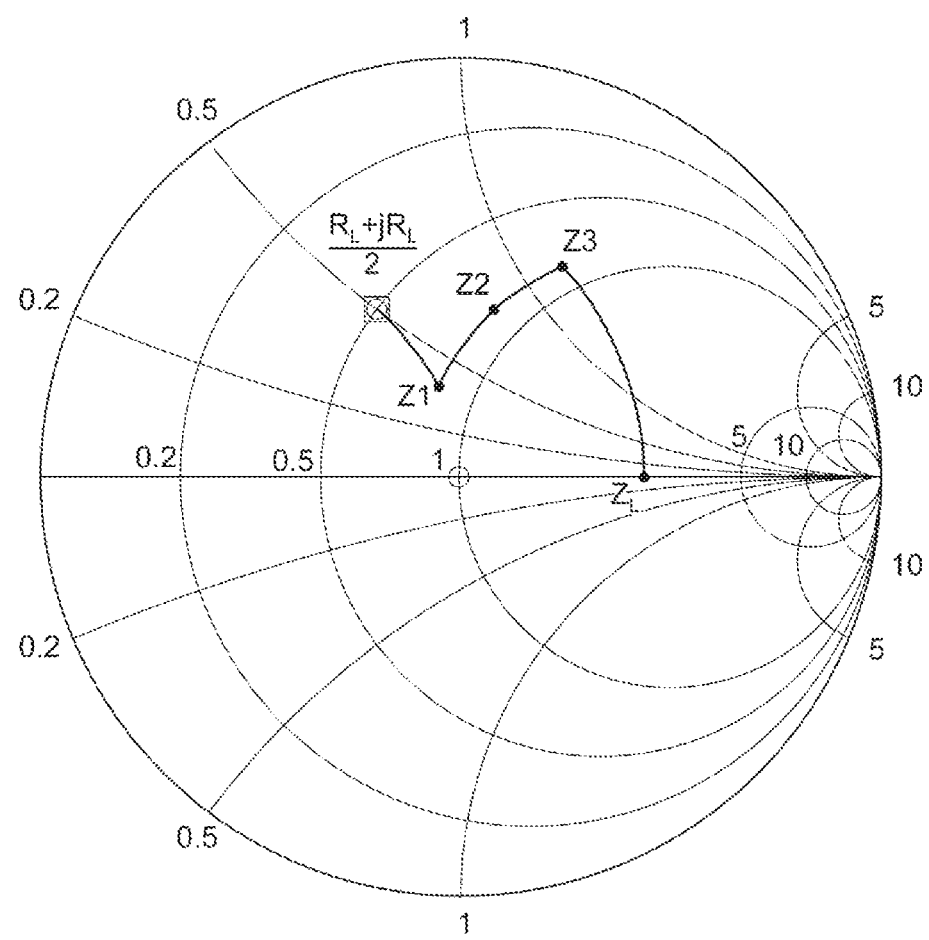
FIG. 9B is an explanatory diagram illustrating the locus of the impedance on the load side as seen from the output end of the carrier amplifier at a back-off time.

FIG. 9A is an explanatory diagram illustrating the locus of an impedance $Z_L$ on the load side as seen from an output end of the carrier amplifier 120 at the peak time. In addition, FIG. 9B is an explanatory diagram illustrating the locus of the impedance $Z_L$ on the load side as seen from the output end of the carrier amplifier 120 at the back-off time. First, at the peak time, the impedance $Z_L$ changes from an impedance $R_L$ of the load seen from the capacitor C5 to $Z_L=R_L$ as a vantage point changes from the capacitor C5, the inductor Lpara2, the inductor Lpara1 and the capacitor C4 in this order (refer to FIGS. 8 and 9A). On the other hand, at the back-off time, the impedance $Z_L$ changes from an impedance $(R_L+jR_L)/2$ of the load seen from the capacitor C5 to a value larger than $R_L$ as a vantage point changes from the capacitor C5, the inductor Lpara2, the inductor Lpara1 and the capacitor C4 in this order (refer to FIGS. 8 and 9B). That is, it is clear that the impedance $Z_L$ increases at the back-off time due to the parasitic inductances of the transformer 130 and the capacitors C4 and C5. For example, the value of the parasitic inductances can be adjusted and the impedance $Z_L$ can be given a desired value by changing the size of the transformer 130.

Figure 10:
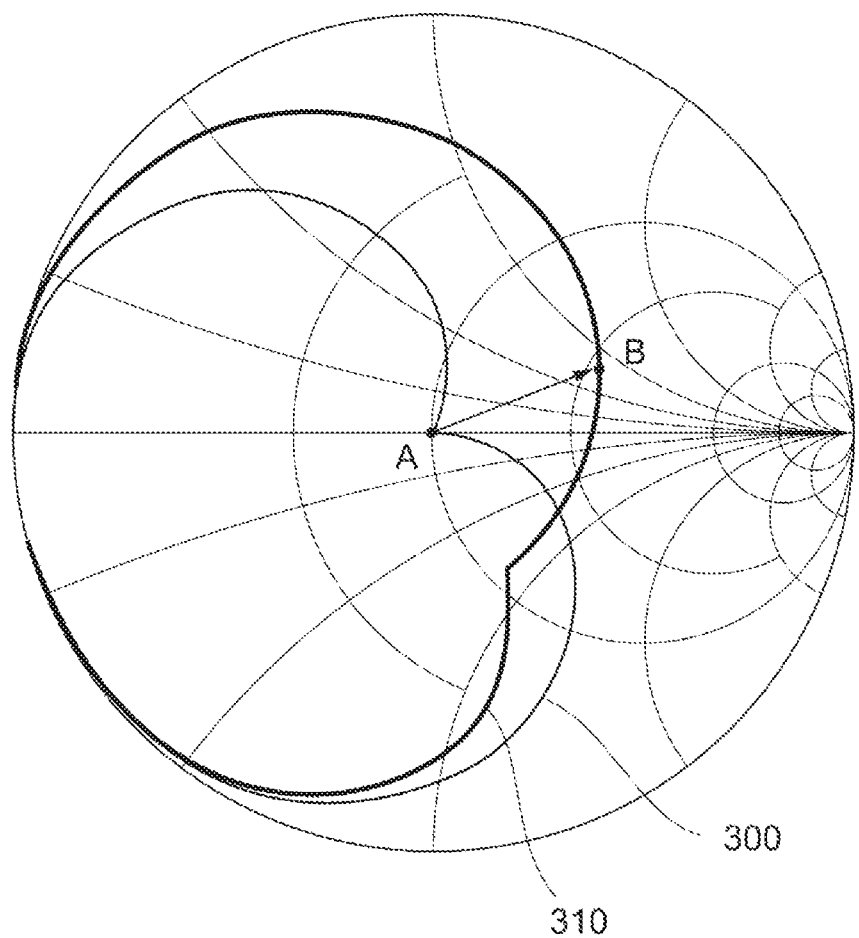
FIG. 10 is an explanatory diagram illustrating the locus of the impedance on the load side as seen from the output end of the carrier amplifier at the peak time and the back-off time.

FIG. 10 is an explanatory diagram illustrating the locus of the impedance $Z_L$ on the load side as seen from the output end of the carrier amplifier 120 at the peak time and the back-off time. Specifically, a locus 300 of the impedance $Z_L$ at the peak time and a locus 310 of the impedance $Z_L$ at the back-off time are illustrated for the case where the frequency of the input signal is changed from 100 MHz to 20 GHz. Point A and point B correspond to 2 GHz. The loci 300 and 310 are normalized using the impedance at the point A at the peak time.

As illustrated in FIG. 10, for example, the impedance $Z_L$ transitions from point A to point B (refer to arrow in FIG. 10) with the switch over from peak time to back-off time in the case where the input signal is 2 GHz. In addition, the impedance at point B is approximately twice that at point A. Thus, the power amplifier circuit 100A has improved efficiency at the back-off time as a result of the impedance $Z_L$ changing.

With this configuration as well, the power amplifier circuit 100A can obtain the same effect as the power amplifier circuit 100. In addition, in the power amplifier circuit 100A, even when the transformers 130 and 132 are affected by parasitic inductances, impedance matching is realized at stages prior and subsequent to the transformers 130 and 132 by providing the capacitors C4 to C7. Although a configuration in which a capacitor is connected in parallel with each of the input-side windings and each of the output-side windings of the transformers 130 and 132 is illustrated in FIG. 7, one or more of the capacitors C4 to C7 need not be provided.

Figure 11:
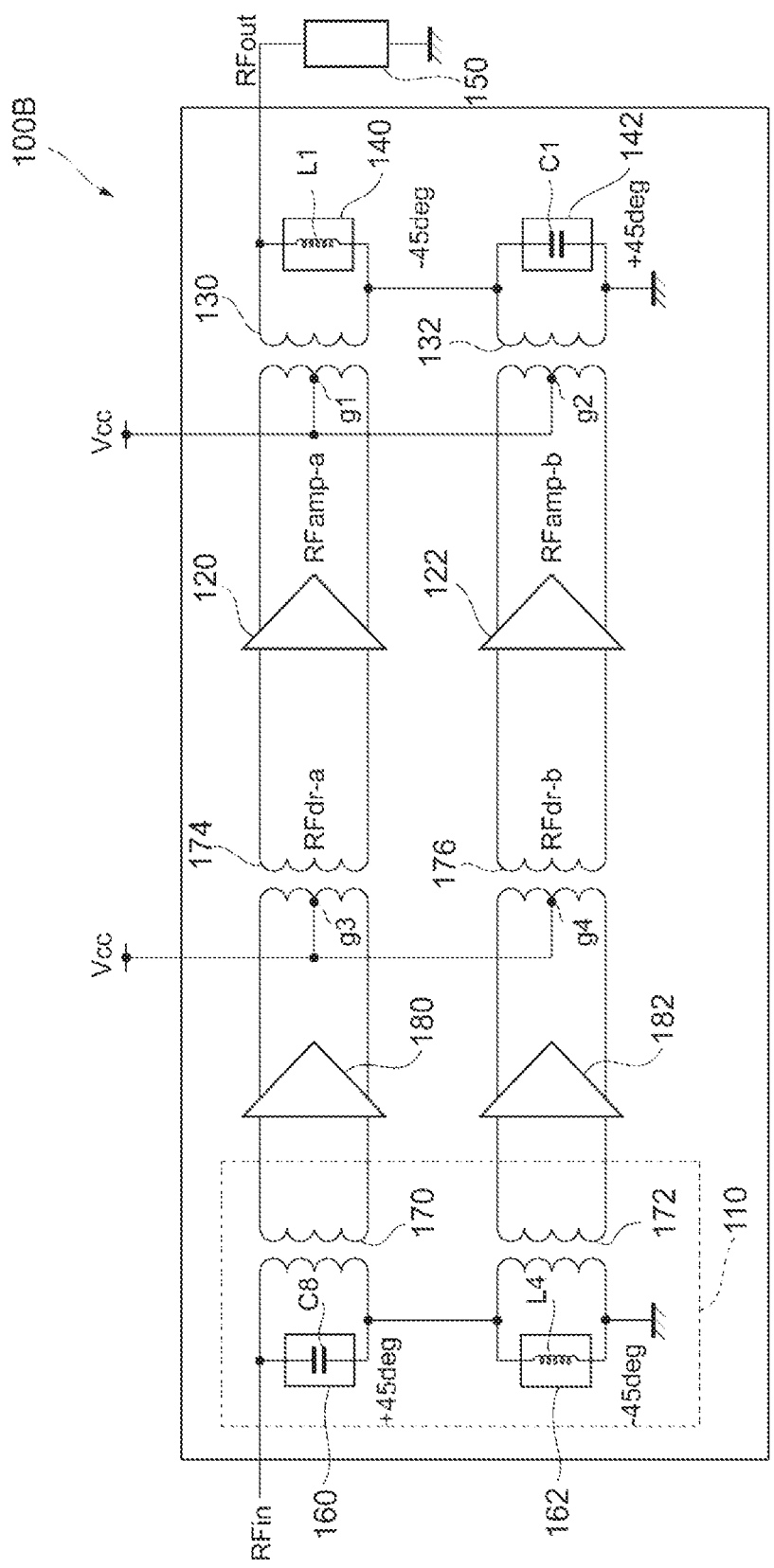
FIG. 11 is a diagram illustrating another example configuration of the power amplifier circuit that is an embodiment of the present disclosure.

FIG. 11 is a drawing that illustrates another example configuration (power amplifier circuit 100B) of the power amplifier circuit 100 that is an embodiment of the present disclosure. The power amplifier circuit 100B has a configuration in which amplifiers are connected in multiple stages, and the amplifiers of the output stage (power stage) are configured as a Doherty amplifier, as in the power amplifier circuit 100.

The initial-stage circuit includes phase shifters 160 and 162, transformers 170, 172, 174 and 176, and amplifiers 180 and 182. The initial-stage circuit amplifies the input signal RFin, and supplies signals RFdr_a and RFdr_b to the carrier amplifier 120 and the peak amplifier 122 of the output stage.

The phase shifter 160 includes a capacitor C8 (third phase conversion element: sixth capacitor) that is connected in parallel with the input-side winding of the transformer 170. The phase shifter 160 outputs a signal (seventh signal)

having a phase that is delayed by approximately 45 degrees relative to the input signal RFin. In addition, the phase shifter 162 includes an inductor L4 (fourth phase conversion element: second inductor) that is connected in parallel with the input-side winding of the transformer 172. The phase shifter 162 outputs a signal (eighth signal) having a phase that is advanced by approximately 45 degrees relative to the input signal RFin. Thus, the phase of the signal output from the phase shifter 162 is advanced by approximately 90 degrees relative to the signal output from the phase shifter 160. In other words, the phase shifters 160 and 162 and the transformers 170 and 172 correspond to the power splitter 110 illustrated in FIG. 1. The configurations of the phase shifters 160 and 162 illustrated in FIG. 11 are substantially the same as those of the phase shifters 140 and 142, and therefore description thereof is omitted. In addition, the phase difference can be adjusted by designing the constants of the capacitor C8 and the inductor L4.

The signal output from the phase shifter 160 is supplied to the amplifier 180 via the input-side winding (third input-side winding) and the output-side winding (third output-side winding) of the transformer 170 (third transformer). In addition, the signal output from the phase shifter 162 is supplied to the amplifier 182 via the input-side winding (fourth input-side winding) and the output-side winding (fourth output-side winding) of the transformer 172 (fourth transformer).

A signal (ninth signal) output from the amplifier 180 of the initial stage (third differential amplifier) is supplied to the carrier amplifier 120 of the output stage via the input-side winding (fifth input-side winding) and the output-side winding (fifth output-side winding) of the transformer 174 (fifth transformer). Similarly, a signal (tenth signal) output from the amplifier 182 of the initial stage (fourth differential amplifier) is supplied to the peak amplifier 122 of the output stage via the input-side winding (sixth input-side winding) and the output-side winding (sixth output-side winding) of the transformer 176 (sixth transformer).

The power supply voltage Vcc is supplied to center points g3 and g4 of the input-side windings of the transformers 174 and 176 in the case of the amplifiers of the initial stage, similarly to the amplifiers of the output stage. Thus, noise caused by the power supply circuit can be suppressed. In other words, the power amplifier circuit 100B can realize a configuration in which amplifiers are connected in multiple stages without necessarily needing to be equipped with a power supply choke coil and bypass capacitor. Therefore, the power amplifier circuit 100B can increase power gain compared with the power amplifier circuits 100 and 100A while achieving a reduction in circuit scale compared with the example of the related art.

In addition, in the power amplifier circuit 100B, impedance matching can be realized between stages prior and subsequent to the transformers without necessarily forming a matching network by adjusting the winding ratios of the transformers 170, 172, 174 and 176, similarly as in the case of the transformers 130 and 132. Therefore, the power amplifier circuit 100B can achieve a reduction in circuit scale compared with the example of the related art.

Although a configuration is illustrated in FIG. 11 in which there are two amplifier stages, there may instead be three or more amplifier stages.

FIG. 12 is a drawing that illustrates another example configuration (power amplifier circuit 100C) of the power amplifier circuit 100 that is an embodiment of the present disclosure. Constituent parts that are the same as in the power amplifier circuit 100 illustrated in FIG. 1 are denoted by the same reference symbols, and description thereof is omitted. The power amplifier circuit 100C is an example configuration for a case where the phase difference between the signal RFin_a input to the carrier amplifier 120 and the signal RFin_b input to peak amplifier 122 in the power amplifier circuit 100 is not limited to 90 degrees and is expanded to 2φ degrees (φ is a real number that satisfies 45≤φ<90).

n represents the impedance conversion ratio of the phase shifter 140 and the phase shifter 142 (n is a real number that satisfies n>1). In other words, the load-side impedance as seen from the outputs of the transformers 130 and 132 is multiplied by 1/n via the phase shifters 140 and 142. At this time, the phase difference between the signal RFin_a input to the carrier amplifier 120 and the signal RFin_b input to the peak amplifier 122 is expressed as $2\phi=2\times\tan^{-1}\{\sqrt{(n-1)}\}$. In addition, the inductance of the inductor L1 is set to $L=R_L/\{\omega\sqrt{(n-1)}\}$. Thus, the phase shifter 140 outputs a signal having a phase that is advanced by approximately $\tan^{-1}\{\sqrt{(n-1)}\}$ degrees relative to the signal output from the output-side winding of the transformer 130. In addition, the capacitance of the capacitor C1 is set to $C=\sqrt{(n-1)}/\omega R_L$. Thus, the phase shifter 142 outputs a signal having a phase that is delayed by approximately $\tan^{-1}\{\sqrt{(n-1)}\}$ degrees relative to the signal output from the output-side winding of the transformer 132.

With this configuration as well, the power amplifier circuit 100C can obtain the same effect as the power amplifier circuit 100. Specifically, for example, in the case where n=4, the phase difference between the signal RFin_a input to the carrier amplifier 120 and the signal RFin_b input to the peak amplifier 122 is 120 degrees, and the phase is converted by 60 degrees in each of the phase shifters 140 and 142.

In each of the above-described embodiments, for example, the power supply voltage may be controlled using an envelope tracking (ET) method in which the amplitude of the power supply voltage changes in accordance with the amplitude of an envelope curve of the input signal at back-off time (that is, an area in which only the carrier amplifier 120 is turned on). Thus, the efficiency of the power amplifier circuit can be improved still further.

In addition, in the power amplifier circuits 100 and 100A to 100C, the carrier amplifier 120, the peak amplifier 122, the transformers 130 and 132, and the phase shifters 140 and 142 may be formed on the same substrate. Furthermore, in the power amplifier circuit 100B, the phase shifters 160 and 162, the transformers 170, 172, 174 and 176 and the amplifiers 180 and 182 may also be formed on the same substrate as the elements that constitute the amplifiers of the output stage. A reduction in circuit scale can be achieved by forming these elements on the same substrate.

Exemplary embodiments of the present disclosure have been described above. The power amplifier circuits 100 and 100A to 100C each include the carrier amplifier 120 and the peak amplifier 122, which are formed of differential amplifiers, and the amplified signals undergo voltage addition in the transformers 130 and 132. Thus, the power amplifier circuits 100 and 100A to 100C can realize operation of a Doherty amplifier without necessarily needing to be equipped with a harmonic termination circuit or a power supply choke coil and bypass capacitor. Therefore, the power amplifier circuits 100 and 100A to 100C can achieve high efficiency and a reduction in circuit scale compared with the example of the related art.

In addition, the power amplifier circuits 100 and 100A to 100C each include, as phase conversion elements, the inductor L1 that is connected in parallel with the output-side winding of the transformer 130, and the capacitor C1 that is connected in parallel with the output-side winding of the transformer 132. Thus, the phases of the amplified signals RFamp_a and RFamp_b, which were shifted by approximately 90 degrees from each other, are made to be the same as each other.

In addition, in the power amplifier circuits 100 and 100A to 100C, the power supply voltage Vcc is supplied to the center points g1 and g2 of the input-side windings of the transformers 130 and 132. Thus, there is no need for the power amplifier circuits 100 and 100A to 100C to be equipped with a power supply choke coil and bypass capacitor. Therefore, the power amplifier circuits 100 and 100A to 100C can achieve a reduction in circuit scale compared with the example of the related art.

Furthermore, impedance matching is realized at least one of between the carrier amplifier 120 and the load and between the peak amplifier 122 and the load by adjusting the winding ratios of the transformers 130 and 132. Thus, the impedances can be matched by the transformers 130 and 132, which are formed on a chip, without necessarily forming an output matching network outside the chip. Therefore, the power amplifier circuits 100 and 100A to 100C can achieve a reduction in circuit scale compared with the example of the related art.

In addition, the power amplifier circuit 100A includes the capacitor C4 that is connected in parallel with the input-side winding of the transformer 130, the capacitor C5 that is connected in parallel with the output-side winding of the transformer 130, the capacitor C6 that is connected in parallel with the input-side winding of the transformer 132 and the capacitor C7 that is connected in parallel with the output-side winding of the transformer 132. Thus, in the power amplifier circuit 100A, impedance matching is realized between stages prior to and subsequent to the transformers 130 and 132 even when the transformers 130 and 132 are affected by parasitic inductances.

In addition, both the amplifiers of the initial stage and the amplifiers of the output stage are formed of differential amplifiers in the power amplifier circuit 100B. Thus, the power amplifier circuit 100B can realized high efficiency and an increase in power gain without necessarily being equipped with a power supply choke coil and bypass capacitor. Therefore, the power amplifier circuit 100B can increase power gain compared with the power amplifier circuits 100 and 100A while achieving a reduction in circuit scale compared with the example of the related art.

In addition, the power amplifier circuit 100B includes, as phase conversion elements, the capacitor C8 that is connected in parallel with the input-side winding of the transformer 170, and the inductor L4 that is connected in parallel with the input-side winding of the transformer 172. Thus, the phase of the input signal RFin can be shifted by approximately 90 degrees and supplied to the amplifiers 180 and 182.

In addition, in the power amplifier circuit 100B, the power supply voltage Vcc is supplied to the center points g3 and g4 of the input-side windings of the transformers 174 and 176. Thus, there is no need for the power amplifier circuit 100B to be equipped with a power supply choke coil and bypass capacitor. Therefore, the power amplifier circuit 100B can achieve a reduction in circuit scale compared with the example of the related art.

The phase difference between the signals input to the carrier amplifier 120 and the peak amplifier 122 is not especially limited, and may be 90 degrees, for example.

In addition, the carrier amplifier 120, the peak amplifier 122, the transformers 130 and 132, the inductor L1 and the capacitor C1 may be formed on the same substrate in the power amplifier circuits 100 and 100A to 100C. A reduction in circuit scale can be achieved by forming these elements on the same substrate.

The purpose of the embodiments described above is to enable easy understanding of the present invention and the embodiments are not to be interpreted as limiting the present invention. The present invention can be modified or improved without departing from the gist of the invention, and equivalents to the present invention are also included in the present invention. In other words, appropriate design changes made to the embodiments by one skilled in the art are included in the scope of the present invention so long as the changes have the characteristics of the present invention. For example, the elements included in the embodiments and the arrangements, materials, conditions, shapes, sizes and so forth of the elements are not limited to those exemplified in the embodiments and can be appropriately changed. In addition, each embodiment is merely an illustrative example and it goes without saying that parts of the configurations illustrated in different embodiments can be substituted or combined with each other, and these new configurations are also included in the scope of the present invention so long as the configurations have the characteristics of the present invention.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A power amplifier circuit comprising:
a first differential amplifier configured to amplify a first signal having a power level greater than or equal to a first level and to output a second signal, the first signal being split from an input signal;
a second differential amplifier configured to amplify a third signal having a power level greater than or equal to a second level and to output a fourth signal, the second level being greater than the first level, and the third signal being split from the input signal and having a phase advanced relative to the first signal by approximately $2\phi$ degrees;
a first transformer comprising a first input-side winding to which the second signal is input, and a first output-side winding that is electromagnetically coupled to the first input-side winding;
a second transformer comprising a second input-side winding to which the fourth signal is input, and a second output-side winding that is electromagnetically coupled to the second input-side winding;
a first phase conversion circuit that is connected in parallel with the first output-side winding, and that outputs a fifth signal having a phase advanced relative to a signal output from the first output-side winding by approximately $\phi$ degrees; and
a second phase conversion circuit that is connected in parallel with the second output-side winding, and that outputs a sixth signal having a phase delayed relative to a signal output from the second output-side winding by approximately $\phi$ degrees,
wherein the first and second output-side windings are connected in series with each other and together output an output signal having a voltage equal to a sum of a voltage of the fifth signal and a voltage of the sixth signal, and wherein $\phi$ is a real number satisfying $45 \leq \phi < 90$.

2. The power amplifier circuit according to claim 1,
wherein the first phase conversion circuit comprises a first inductor, and
the second phase conversion circuit comprises a first capacitor.

3. The power amplifier circuit according to claim 1, wherein a power supply voltage is supplied to a center point of the first input-side winding and to a center point of the second input-side winding.

4. The power amplifier circuit according to claim 1,
wherein the first transformer matches an output impedance of the first differential amplifier and an input impedance of a load disposed subsequent to the power amplifier circuit, and
the second transformer matches an output impedance of the second differential amplifier and an input impedance of the load.

5. The power amplifier circuit according to claim 1, further comprising:
a second capacitor that is connected in parallel with the first input-side winding;
a third capacitor that is connected in parallel with the first output-side winding;
a fourth capacitor that is connected in parallel with the second input-side winding; and
a fifth capacitor that is connected in parallel with the second output-side winding.

6. The power amplifier circuit according to claim 1, further comprising:
a third transformer comprising a third input-side winding to which the input signal is input, and a third output-side winding that is electromagnetically coupled to the third input-side winding;
a fourth transformer comprising a fourth input-side winding to which the input signal is input, and a fourth output-side winding that is electromagnetically coupled to the fourth input-side winding;
a third phase conversion circuit that is connected in parallel with the third input-side winding, and that outputs a seventh signal having a phase that is delayed relative to the input signal by approximately $\phi$ degrees;
a fourth phase conversion circuit that is connected in parallel with the fourth input-side winding, and that outputs an eighth signal having a phase that is advanced relative to the input signal by approximately $\phi$ degrees;
a third differential amplifier configured to amplify the seventh signal and to output a ninth signal;
a fourth differential amplifier configured to amplify the eighth signal and to output a tenth signal;
a fifth transformer comprising a fifth input-side winding to which the ninth signal is input, and a fifth output-side winding that is electromagnetically coupled to the fifth input-side winding and that outputs the first signal; and
a sixth transformer comprising a sixth input-side winding to which the tenth signal is input, and a sixth output-side winding that is electromagnetically coupled to the sixth input-side winding and that outputs the third signal.

7. The power amplifier circuit according to claim 6,
wherein the third phase conversion circuit comprises a sixth capacitor, and
the fourth phase conversion circuit comprises a second inductor.

8. The power amplifier circuit according to claim 6, wherein a power supply voltage is supplied to a center point of the fifth input-side winding and to a center point of the sixth input-side winding.

9. The power amplifier circuit according to claim 1, wherein $\phi$ is 45.

10. The power amplifier circuit according to claim 6, wherein $\phi$ is 45.

11. The power amplifier circuit according to claim 1, wherein the first and second differential amplifiers, the first and second transformers, and the first and second phase conversion circuits are formed on a common substrate.

12. The power amplifier circuit according to claim 1, wherein the first differential amplifier is a class AB amplifier and the second differential amplifier is a class C amplifier.

13. The power amplifier circuit according to claim 2, wherein a power supply voltage is supplied to a center point of the first input-side winding and to a center point of the second input-side winding.

14. The power amplifier circuit according to claim 2,
wherein the first transformer matches an output impedance of the first differential amplifier and an input impedance of a load disposed subsequent to the power amplifier circuit, and
the second transformer matches an output impedance of the second differential amplifier and an input impedance of the load.

15. The power amplifier circuit according to claim 3,
wherein the first transformer matches an output impedance of the first differential amplifier and an input impedance of a load disposed subsequent to the power amplifier circuit, and
the second transformer matches an output impedance of the second differential amplifier and an input impedance of the load.

16. The power amplifier circuit according to claim 2, further comprising:
a second capacitor that is connected in parallel with the first input-side winding;
a third capacitor that is connected in parallel with the first output-side winding;
a fourth capacitor that is connected in parallel with the second input-side winding; and
a fifth capacitor that is connected in parallel with the second output-side winding.

17. The power amplifier circuit according to claim 3, further comprising:
a second capacitor that is connected in parallel with the first input-side winding;
a third capacitor that is connected in parallel with the first output-side winding;
a fourth capacitor that is connected in parallel with the second input-side winding; and
a fifth capacitor that is connected in parallel with the second output-side winding.

18. The power amplifier circuit according to claim 4, further comprising:
a second capacitor that is connected in parallel with the first input-side winding;
a third capacitor that is connected in parallel with the first output-side winding;
a fourth capacitor that is connected in parallel with the second input-side winding; and
a fifth capacitor that is connected in parallel with the second output-side winding.

19. The power amplifier circuit according to claim 2, further comprising:

a third transformer comprising a third input-side winding to which the input signal is input, and a third output-side winding that is electromagnetically coupled to the third input-side winding;
a fourth transformer comprising a fourth input-side winding to which the input signal is input, and a fourth output-side winding that is electromagnetically coupled to the fourth input-side winding;
a third phase conversion circuit that is connected in parallel with the third input-side winding, and that outputs a seventh signal having a phase that is delayed relative to the input signal by approximately ϕ degrees;
a fourth phase conversion circuit that is connected in parallel with the fourth input-side winding, and that outputs an eighth signal having a phase that is advanced relative to the input signal by approximately ϕ degrees;
a third differential amplifier configured to amplify the seventh signal and to output a ninth signal;
a fourth differential amplifier configured to amplify the eighth signal and to output a tenth signal;
a fifth transformer comprising a fifth input-side winding to which the ninth signal is input, and a fifth output-side winding that is electromagnetically coupled to the fifth input-side winding and that outputs the first signal; and
a sixth transformer comprising a sixth input-side winding to which the tenth signal is input, and a sixth output-side winding that is electromagnetically coupled to the sixth input-side winding and that outputs the third signal.

20. The power amplifier circuit according to claim 3, further comprising:

a third transformer comprising a third input-side winding to which the input signal is input, and a third output-side winding that is electromagnetically coupled to the third input-side winding;
a fourth transformer comprising a fourth input-side winding to which the input signal is input, and a fourth output-side winding that is electromagnetically coupled to the fourth input-side winding;
a third phase conversion circuit that is connected in parallel with the third input-side winding, and that outputs a seventh signal having a phase that is delayed relative to the input signal by approximately ϕ degrees;
a fourth phase conversion circuit that is connected in parallel with the fourth input-side winding, and that outputs an eighth signal having a phase that is advanced relative to the input signal by approximately ϕ degrees;
a third differential amplifier configured to amplify the seventh signal and to output a ninth signal;
a fourth differential amplifier configured to amplify the eighth signal and to output a tenth signal;
a fifth transformer comprising a fifth input-side winding to which the ninth signal is input, and a fifth output-side winding that is electromagnetically coupled to the fifth input-side winding and that outputs the first signal; and
a sixth transformer comprising a sixth input-side winding to which the tenth signal is input, and a sixth output-side winding that is electromagnetically coupled to the sixth input-side winding and that outputs the third signal.

* * * * *